(12) United States Patent
Jeon et al.

(10) Patent No.: US 6,589,360 B2  
(45) Date of Patent: Jul. 8, 2003

(54) DRYING SYSTEM FOR DRYING SEMICONDUCTOR WAFERS AND METHOD OF DRYING WAFERS USING THE SAME

(75) Inventors: Pyeong Sik Jeon, Cheonan (KR); Hyoung Chul Choi, Suwon (KR)

(73) Assignee: Samsung Electronics Co., Ltd., Suwon (KR)

( * ) Notice: Subject to any disclaimer, the term of this patent is extended or adjusted under 35 U.S.C. 154(b) by 199 days.

(21) Appl. No.: 09/878,969

(22) Filed: Jun. 13, 2001

(65) Prior Publication Data

US 2002/0023668 A1 Feb. 28, 2002

(30) Foreign Application Priority Data

Aug. 24, 2000 (KR) ........................................ 2000-49205

(51) Int. Cl.⁷ ................................................. B08B 3/00
(52) U.S. Cl. .............................. 134/30; 134/135; 134/2; 134/18; 134/21; 134/902; 34/340; 34/471
(58) Field of Search ................................ 134/2, 18, 21, 134/25.1, 26, 32, 30, 37, 44, 60, 61, 115 R, 117, 133, 902; 34/340, 471

(56) References Cited

U.S. PATENT DOCUMENTS 5,940,985 A * 8/1999 Kamikawa et al. ........... 34/471
6,119,366 A * 9/2000 Ferrell et al. .................. 34/340
6,244,281 B1 * 6/2001 Ohsawa et al. ............. 134/135
6,375,758 B1 * 4/2002 Nakashima et al. .......... 134/30

\* cited by examiner

Primary Examiner—Randy Gulakowski  
Assistant Examiner—Gentle E Winter  
(74) Attorney, Agent, or Firm—Volentine Francos, PLLC

(57) ABSTRACT

A method of and system for drying a wafer offer a short cycle of operation, and minimize the amount of time that the wafer is exposed to external air. The drying system includes a process bath, a loader for transferring the wafer from a wash bath to an elevator of the process bath, an unloading stage for supporting the wafer after it is dried, and a lid for drying the wafer after it is rinsed in the process bath and for transferring the wafer onto the unloading stage. The lid includes a lid body defining a cavity, a wafer holder disposed within the cavity, a gas distributer having gas injection holes facing the cavity, and a driving mechanism for moving the lid between the process bath and the unloading stage. In the drying method, the lid is positioned over the process bath after the wafer has been rinsed. The elevator of the process bath is then raised to move the rinsed wafer above the tub of the process bath and into the cavity defined in the lid body. Next, the wafer is secured to the lid, within the cavity, by the wafer holder. A dried gas is then injected by the gas distributer into the cavity of the lid and onto the wafer, thereby drying the wafer. Finally, the lid is moved to the unloading stage where the wafer is released by the wafer holder.

15 Claims, 5 Drawing Sheets

DRYING SYSTEM FOR DRYING SEMICONDUCTOR WAFERS AND METHOD OF DRYING WAFERS USING THE SAME

BACKGROUND OF THE INVENTION

1. Field of the Invention

The present invention relates to the washing of semiconductor wafers during the manufacturing of semiconductor devices. More particularly, the present invention relates to a method of and apparatus for drying wafers at the end of a wet-wash process carried out in the course of semiconductor fabrication.

2. Description of the Related Art

During the fabricating of semiconductor devices from silicon wafers, the wafers are exposed to and contaminated by various particles or chemicals. As the integrated circuits of semiconductor devices become smaller and more highly integrated, contaminants as small as about 0.1 $\mu$m in diameter can now affect the operability of the semiconductor devices. Therefore, it is very difficult to keep the wafers sufficiently clean.

Today, the cleaning of the wafers accounts for approximately 30–40% of the total manufacturing process. The cleaning process thus continues to grow in importance as the design rule of the semiconductor devices decreases.

FIG. 1 shows a drying system 50 of a conventional wet station for cleaning wafers. As shown in FIG. 1, the drying system 50 comprises a loader 32, a process bath 14, a lid 40, an unloader 34, and an unloading stage 18. The arrows (solid lines) designated by reference numeral 36 represent the path along which elements holding the wafer are moved through the system 50. On the other hand, the arrows (dotted lines) designated by reference numeral 38 represent the path along which the elements are moved through the system 50 after leaving the wafer off at some point in the station.

More specifically, the loader 32 transfers a wafer 31 from a wash bath 12 to the process bath 14. The washing of the wafer in the wash bath 12 constitutes the final phase of a wet-wash process.

The process bath 14 serves to rinse the wafer 31. To this end, the process bath comprises a tub of deionized water 15. The process bath 14 also comprises a lift or elevator 13 for moving the wafer 31 into/out of the tub, and an outlet valve 19 for discharging the deionized water 15 from the tub.

The lid 40 is positioned above the process bath 14. The lid 40 comprises a gas distributer (not shown). A dried gas such as nitrogen or IPA (isopropyl alcohol) is blown onto the wafer 31 through the gas distributer to dry the rinsed wafer.

The unloader 34 transfers the wafer 33 from the elevator 13 to the unloading stage 18. At this time, the wafer 33 has already finished drying on the elevator 13. A carrier 17 for receiving the wafer 33 is positioned under the unloading stage 18. When a predetermined number of the wafers 33 have been moved onto the unloading stage 18, the unloading stage 18 containing the wafers 33 is lowered into the carrier 17 and the wafers 33 are thereby transferred into the carrier 17.

FIG. 2 is a flow chart of the drying process 20 carried out by the drying system 50. The drying process 20 will be described in detail below referring to FIGS. 1 and 2.

First, a wafer 31 that has already been washed in the wash bath 12 is prepared (step 21).

Next, a wafer-loading step 22 is carried out. In order to submerge the wafer 31 in the deionized water 15, first, the elevator 13 is raised above the level of the deionized water 15 (sub-step 22a). The loader 32 picks up the wafer 31 in the wash bath 12 and places the wafer 31 on the elevator 13 (sub-step 22b).

Then, the elevator 13 holding the wafer 31 is lowered into the deionized water 15. Thus, the wafer 31 is rinsed by the deionized water 15 (step 23). During this time, the loader 32 is returned to its former position.

Next, the wafer 31 is dried (step 24). To this end, the lid 40 is moved over the process bath 14 (sub-step 24a). The elevator 13 supporting the wafer 31 is raised above the deionized water 15 to a position at which the wafer 31 is covered by the lid 40 (sub-step 24b). Nitrogen or IPA gas is injected (sub-step 24c) from the lid 40 onto the wafer 31 to dry the wafer 31.

Finally, the wafer 31 is unloaded (step 25). First, the deionized water 15 is discharged from the tub of the process bath 14 by opening the outlet valve 19 (sub-step 25a). The elevator 13 supporting the wafer 31 is then lowered into the empty tub of the process bath 14 (sub-step 25b). Next, the lid 40 is returned to its former position (sub-step 25c). Subsequently, the elevator 13 still supporting the wafer 31 is again lifted above the tub of the process bath 14 (sub-step 25d). The unloader 34 picks up the wafer 31 on the elevator 13 and transfers the wafer 31 to the unloading stage 18 (sub-step 25e).

The above-described conventional drying system has a drawback in that it has a complex structure that takes a long time to carry out a cycle of operation comprising the drying process. Furthermore, the wafer is exposed to the air for a long period of time during the process. Accordingly, watermarks can readily form on the wafers.

SUMMARY OF THE INVENTION

Accordingly, an object of the present invention is to provide apparatus for drying a wafer and having a short cycle of operation.

Another object of the present invention is to provide apparatus for drying a wafer while minimizing the time that the wafer is exposed to external air.

In order to achieve these objects, the present invention provides a drying system comprising a process bath that includes a tub of deionized water and an elevator for moving the wafer from a position beneath the surface of the water to a position above the tub, a loader for transferring the wafer from a wash bath to the elevator of the process bath, an unloading stage, and a lid comprising an integrated lid body, gas distributer, wafer chuck and reciprocating drive for drying the wafer after the wafer is rinsed in the process bath and for transferring the wafer to the unloading stage.

Preferably, the lid body is transparent so that the wafer can be seen therethrough.

Another object of the present invention is to provide a method of drying a wafer in a short amount of time.

To achieve this object, the present invention provides a drying method in which a wafer is prepared for being dried after the wafer has undergone the final phase of a wash process in a wash bath, an elevator is positioned beneath the surface of rinsing liquid of a process bath, the wafer is transferred from the wash bath to the process bath, and the wafer is loaded onto the elevator while the elevator is positioned beneath the surface of the rinsing liquid. Accordingly, the wafer is submerged in the rinsing liquid without the need to mount the wafer on the elevator and then lower the elevator once the loader has arrived at the process bath.

Still further, another object of the present invention is to provide a method of drying a wafer in a short cycle and while minimizing the exposure of the wafer to external air.

To achieve this object, the present invention also provides a drying method comprising the steps of preparing a wafer for being dried after the wafer has undergone the final phase of a washing process in a wash bath, transferring the wafer from the wash bath to an elevator of a process bath, and rinsing the wafer with rinsing liquid of the process bath, moving a lid to a position above the process bath, subsequently raising the elevator to move the rinsed wafer into a cavity defined in the lid, securing the wafer to the lid, injecting a dried gas into the cavity and onto the wafer to thereby dry the wafer within the cavity, and moving the lid with the wafer secured within the cavity to an unloading stage.

Finally, another object of the present invention is to ensure that the method above provides a sufficiently large drying capacity. To achieve this object, the dried gas is injected onto the wafer within the cavity of the lid while the lid is being moved to the unloading stage.

BRIEF DESCRIPTION OF THE DRAWINGS

These and other objects, features and advantages of the present invention will be readily understood by referring to the following detailed description thereof provided in conjunction with the accompanying drawings, wherein like reference numerals designate like structural elements, and, of which.

DETAILED DESCRIPTION OF THE PREFERRED EMBODIMENTS

Figure 1:
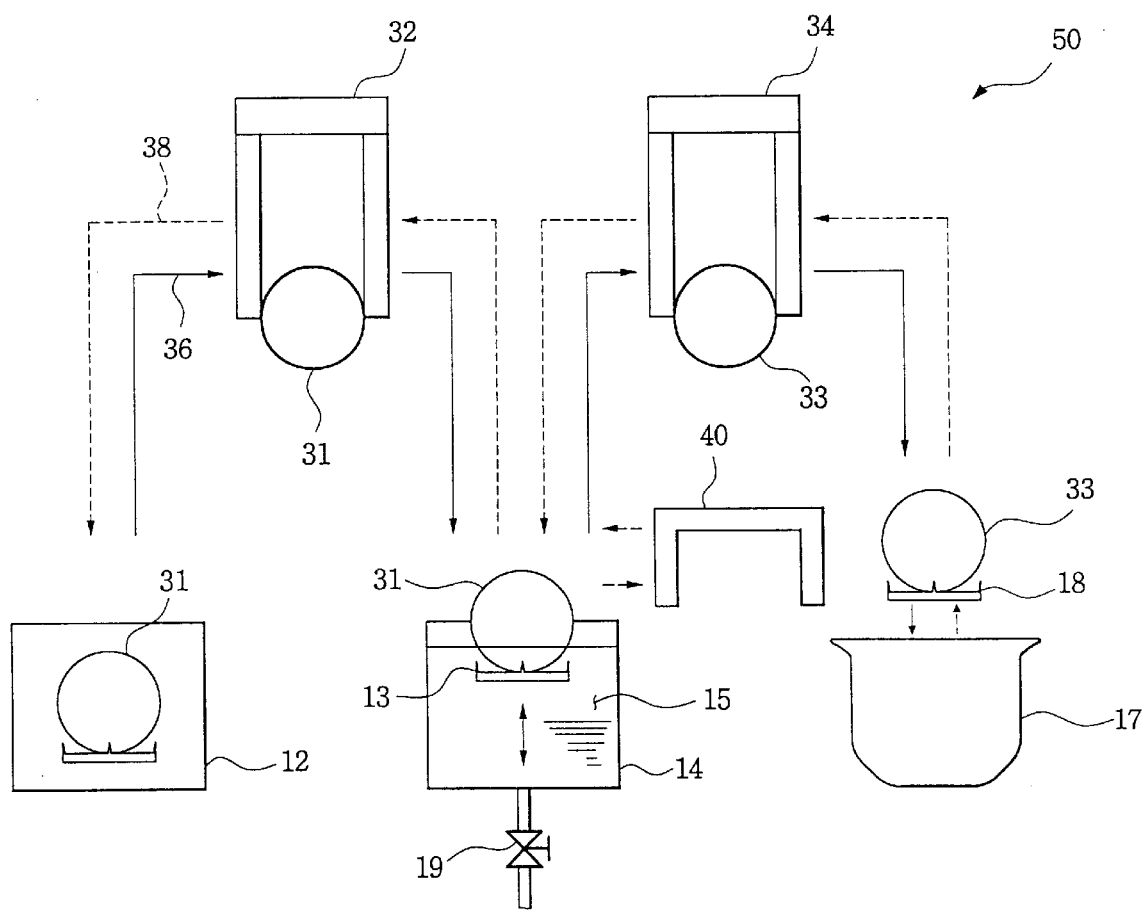
FIG. 1 is a schematic diagram of a drying system of a conventional wet-wash station.
Figure 2:
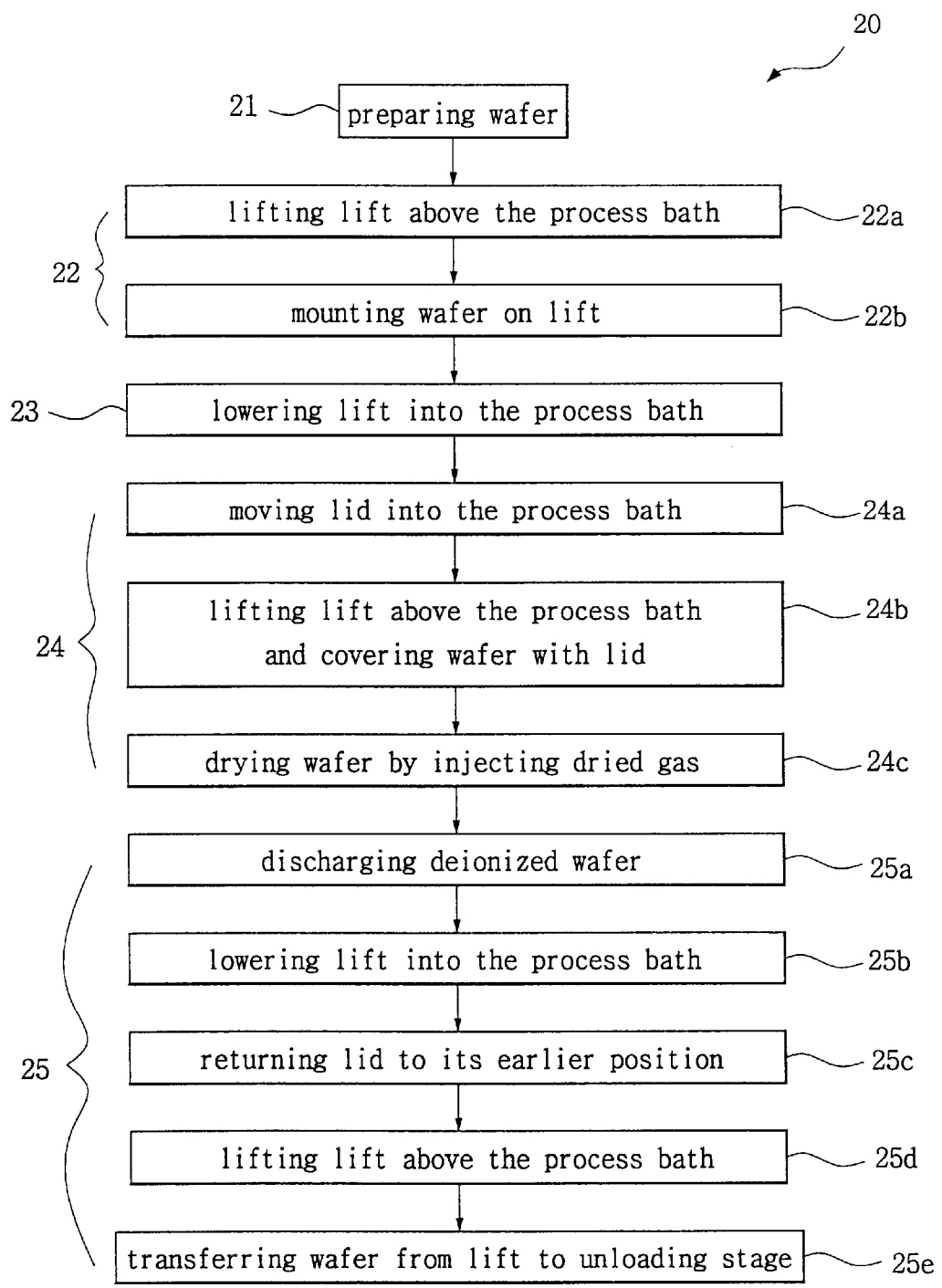
FIG. 2 is a flow chart of the drying process performed by the drying system of FIG. 1.
Figure 3:
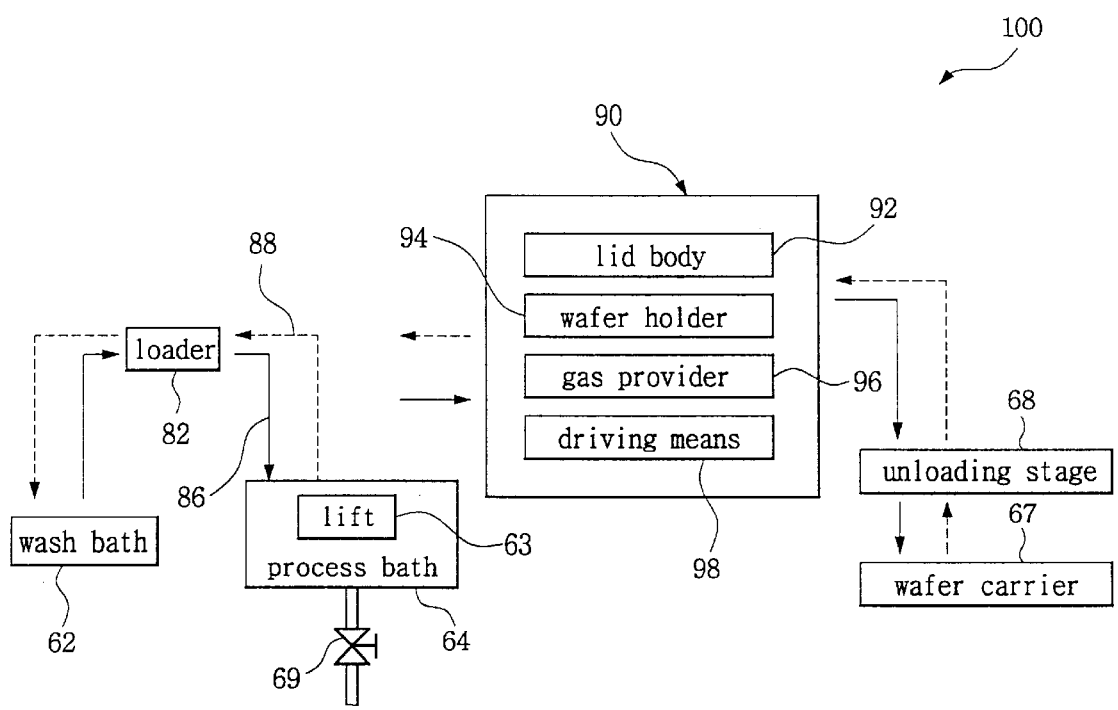
FIG. 3 is a schematic diagram of a drying system of a wet-wash station in accordance with the present invention.

As shown in FIG. 3, the drying system 100 of the present invention comprises a loader 82, a process bath 64, a lid 90, and an unloading stage 68. The arrows (solid lines) designated by reference numeral 86 represent the path along which elements holding a wafer are moved through the system 100. On the other hand, the arrows (dotted lines) designated by reference numeral 88 represent the path along which the elements are moved through the system 100 after leaving the wafer off at some point.

The loader 82 transfers a wafer from a wash bath 62 to the process bath 64. At this time, the wafer has already finished being washed, and has been set aside the wash bath 62.

The process bath 64 serves to rinse the washed wafer and to this end comprises a tub filled with deionized water. The process bath 64 also comprises a lift or elevator 63 for moving the wafer 31 into/out of the tub, and an outlet valve 69 for discharging the deionized water. The outlet valve 69 is disposed in a line connected to the bottom of the tub of the process bath 64.

After the wafer is dried, the wafer is mounted on the unloading stage 68. A carrier 67 for receiving the wafer is positioned under the unloading stage 68. Once a predetermined number of the wafers are mounted on the unloading stage 68, the unloading stage 68 is lowered into the carrier 67, whereby the wafers are transferred the carrier 67.

Figure 5:
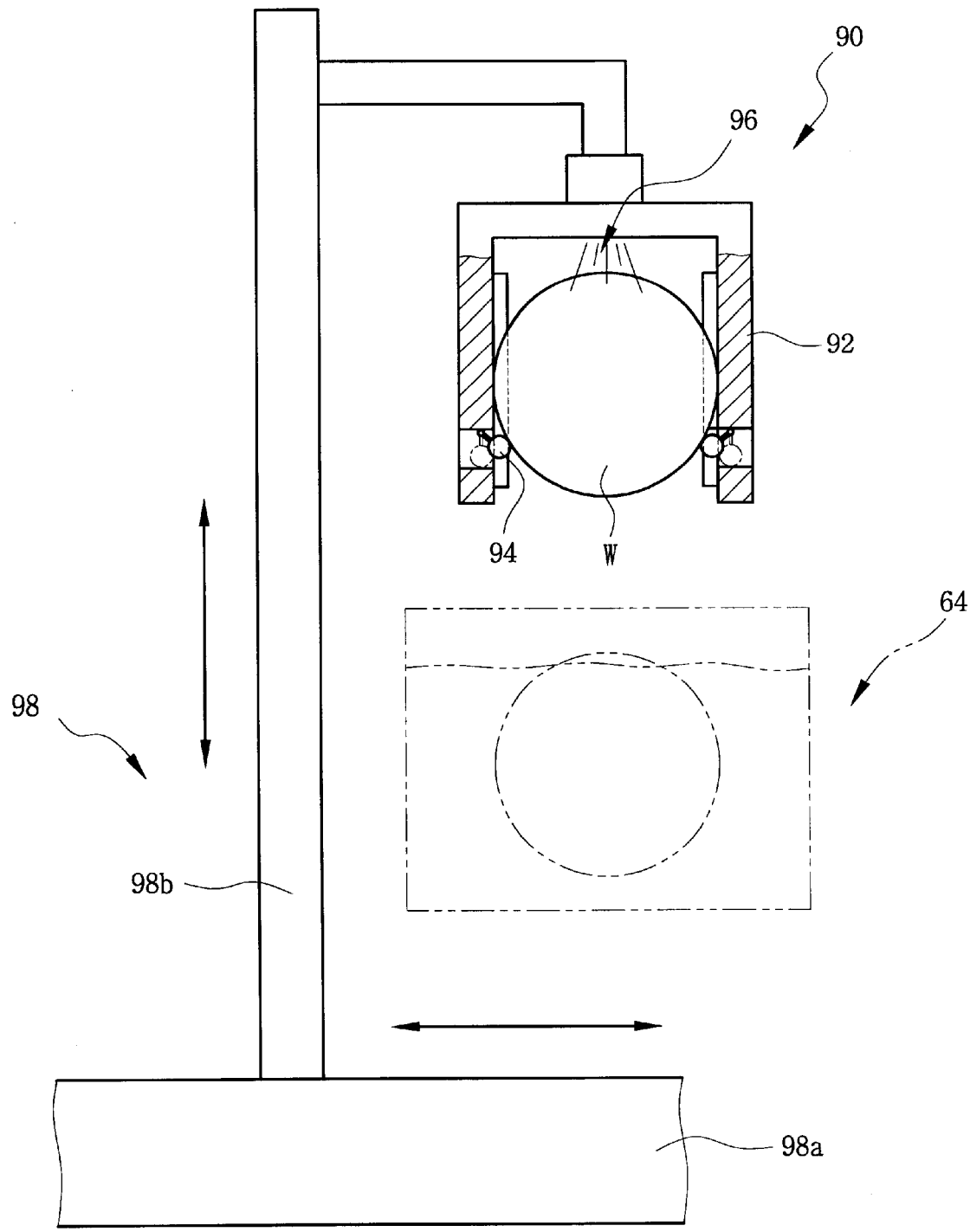
FIG. 5 is a schematic diagram of a lid of the drying system according to the present invention.

The lid 90 serves to transfer the wafer onto the unloading stage 68 as well as to facilitate the drying of the wafer. More specifically, as shown in FIGS. 3 and 5, the lid 90 comprises a lid body 92, a wafer holder (chuck) 94, a gas distributer 96, and a driving means 98. The lid body 92 defines a cavity 92a at the bottom thereof. Preferably, the lid body 92 is made of a transparent material so that a wafer W can be viewed when it is within the cavity 92a of the lid body 92. The cavity 92a is configured to receive the wafer W raised to a predetermined position by the elevator 63. The wafer holder 94 is disposed on the lower surface of the lid body 92 and can hold and release the wafer W within the cavity 92a. The gas distributer 96 is disposed on the lid body 92 and is connected to a source S of dried gas, such as nitrogen or IPA (isopropyl alcohol). The gas distributer 96 has a plurality of openings facing the cavity 92a and through which openings the dried gas is blown onto a wafer W held by the wafer holder 94 within the cavity 92a. The driving means 98 is operatively connected to the lid body 92 so as to move the lid body 92 vertically and horizontally, and has a working envelope sufficient to move the lid body 92 between the process bath 64 and the unloading stage 68. In particular, as shown in FIG. 5, the driving means 98 can comprise independent horizontally and vertically reciprocating drive systems 98a, 98b of any known type per se, e.g. cylinders, that are suitable for moving the lid body 92 between the process bath 64 and unloading stage 68.

After the wafer is rinsed, the lid 90 is moved over the process bath 64. The elevator 63 holding the wafer is raised to lift the wafer above the rinsing liquid of the process bath 64, whereby the wafer is covered by the lid body 92. The wafer holder 94 within the cavity 92a of the lid body 92 then grasps the wafer. The gas distributer 96 then injects the dried gas onto the wafer held by the wafer holder 94, whereby the wafer is dried. Then, the driving means 98 moves the lid body 92 from the process bath 64 to the unloading stage 68. The wafer holder 94 releases the wafer to thereby load the wafer onto the unloading stage 68.

Figure 4:
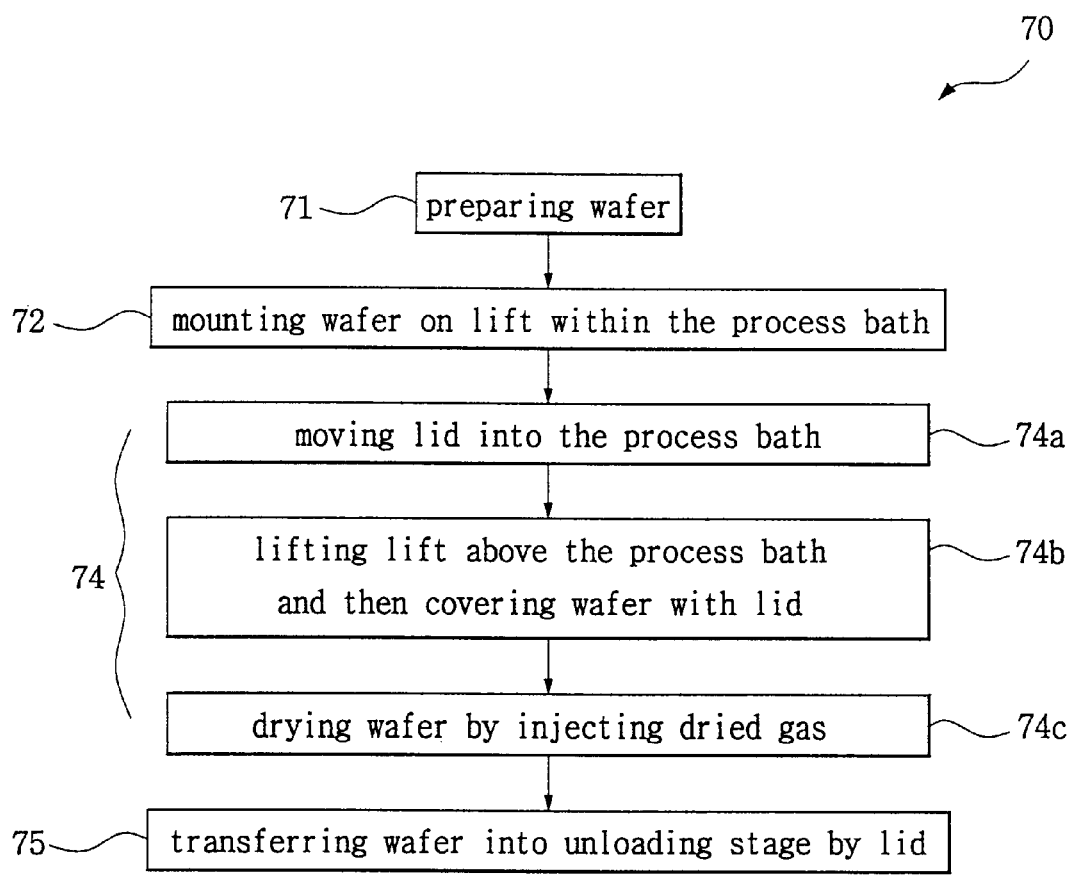
FIG. 4 is a flow chart of the drying process performed by the drying system of the present invention.

FIG. 4 is a flow chart of the drying method 70 performed by the drying system 100. The drying method will now be described in detail below referring to FIG. 3 and FIG. 4.

First, a wafer that has already been washed in the wash bath 62 is prepared (step 71).

The wafer is transferred to the elevator 63 of the process bath 64 while the elevator 63 is submerged in the rinsing liquid (deionized water) of the bath 64. Accordingly, the wafer is rinsed with the deionized water (step 72). In this step, the loader 82 picks up the wafer at the wash bath 62 and lowers the wafer onto the elevator 63 that has already been submerged in the deionized water of the process bath 64. Then, the loader 82 is returned to its former position.

In the conventional drying method, 1) the lift is raised above the process bath, 2) the wafer is mounted on the lift, and 3) the lift is then lowered into the deionized water of the process bath. On the other hand, in the present invention, the wafer is directly transferred onto the submerged elevator 63 where the wafer is rinsed with the deionized water. Therefore, the method of the present invention has fewer steps than the prior art method between the time the wafer is picked up from the wash bath to the time the wafer is rinsed. Therefore, the present invention saves time.

Next, the wafer is dried (step 74). First, the lid body 92 is moved over the process bath 64 (sub-step 74a). The elevator 63 holding the wafer is then raised to lift the wafer above the tub of the process bath 64 (sub-step 74b), whereupon the wafer is received within the cavity of the lid body 92. At this time, the wafer holder 94 grasps the wafer to secure the wafer tot he lid body 92. Nitrogen/IPA gas is then injected into the cavity of the lid body 92 by the gas distributer 96, thereby drying the wafer (sub-step 74c). The drying of the wafer comprises a steam-drying technique utilizing the Nirangoni Effect, i.e., a metathesis between IPA gas and deionized water in a nitrogen gas atmosphere.

Subsequently, the wafer is unloaded (step 75). That is, the lid 90 transfers the wafer onto the unloading stage 68. More specifically, the driving means 98 of the lid 90 moves the lid body 92 from its position above the process bath 64 to a position above the unloading stage 68. The gas distributer 96 also injects nitrogen/IPA gas or pure nitrogen gas onto the wafer within the cavity 92a for a predetermined time during the moving of the wafer from the process bath 64 to the unloading stage 68. This increases the drying capacity and prevents the wafer from being exposed to the external air. Then, the wafer holder 94 releases the wafer to unload the wafer, i.e., to load the wafer onto the unloading stage 68. Subsequently, the lid 90 is returned to its former position.

When a predetermined number of the wafers are mounted on the unloading stage 68, the unloading stage 68 is lowered into the carrier 67. As a result, the wafers are transferred to the carrier 67.

As can be readily appreciated from the detailed description above, the components of the drying system of the present invention have a relatively simple operative relationship, and the time of operation of the system through one cycle is relatively short in comparison with the prior art.

Furthermore, the present invention surrounds the wafer with nitrogen/IPA gas or only nitrogen gas while the wafer is being transferred to the unloading stage. Therefore, the present invention reduces the exposure of the wafer to external air in comparison with the prior art, and can dry wafers more thoroughly than the prior art system.

Although the present invention have been described in detail hereinabove with respect to the preferred embodiments thereof, many variations and/or modifications of the basic concepts of the invention will become apparent to those skilled in the art. All such variations and/or modifications are seen to be within the true spirit and scope of the present invention as defined by the appended claims.

What is claimed is:

1. A drying system for use in drying a wafer during the manufacturing of a semiconductor device, said system comprising:

a process bath comprising a tub of deionized water, and an elevator for moving a wafer vertically into and out of the tub;

an unloading stage on which the wafer is supported after it has been dried; and a lid comprising a lid body defining a cavity open at the bottom of the lid body, the cavity being sized to accommodate a wafer therein, a wafer chuck disposed in said cavity and operative to hold and release a wafer, a gas distributer integrated with said lid body and having gas supply openings facing into said cavity and through which gas can be injected onto a wafer held within the cavity by the wafer chuck, and driving means for moving the lid body between the process bath and the unloading stage.

2. The drying system of claim 1, wherein said lid body is of a transparent material so that a wafer held in the cavity of said lid body by said wafer chuck can be seen through said lid body.

3. The drying system of claim 1, and further comprising a loader operative to transport a wafer onto the lift of said process bath.

4. The drying system of claim 3, wherein said loader comprises horizontally and vertically reciprocatable linear driving mechanisms, and said driving means of the lid is a coupling connecting said lid body to said driving mechanisms.

5. The drying system of claim 1, wherein said driving means of the lid comprises horizontally and vertically reciprocatable linear driving mechanisms connected to said lid body.

6. A method of drying a wafer after the wafer has been washed in the course of manufacturing semiconductor devices, said method comprising:

preparing a wafer for being dried after the wafer has been washed in a wash bath;

positioning an elevator of a process bath beneath the surface of rinsing liquid of the process bath, and transferring the wafer from the wash bath onto the elevator of the process bath, whereby the wafer is submerged in the rinsing liquid whereupon the wafer is rinsed;

moving a lid, defining a cavity in the bottom thereof of a size that will accommodate the wafer, over the process bath;

once the lid is disposed above the process bath, raising the elevator with the wafer disposed thereon to move the wafer into the cavity of the lid;

securing the wafer to the lid;

while the wafer is disposed in the cavity of the lid, injecting a dried gas into the cavity and onto the wafer to thereby dry the wafer within the cavity; and with the wafer secured to the lid, moving the lid to an unloading stage; and subsequently releasing the wafer from the lid to facilitate a transferring of the wafer to the unloading stage.

7. The drying method of claim 6, wherein the dried gas is injected onto the wafer within the cavity of the lid while the lid is being moved to the unloading stage.

8. The drying method of claim 6, wherein the dried gas is injected onto the wafer within the cavity of the lid for both a predetermined period of time while the lid is disposed directly over the process bath, and while the lid is being moved towards the unloading stage.

9. The drying method of claim 6, wherein the wafer is secured to the lid once the elevator has moved the wafer into the cavity of the lid, and while the dried gas is being injected into the cavity.

10. The drying method of claim 7, wherein the wafer is secured to the lid once the elevator has moved the wafer into the cavity of the lid, and while the dried gas is being injected into the cavity.

11. The drying method of claim 8, wherein the wafer is secured to the lid once the elevator has moved the wafer into the cavity of the lid, and while the dried gas is being injected into the cavity.

12. The drying method of claim 6, wherein the wafer is loaded onto the elevator while the elevator is positioned beneath the surface of the rinsing liquid.

13. A method of drying a wafer after the wafer has been washed in the course of manufacturing semiconductor devices, said method comprising:

preparing a wafer for being dried after the wafer has been washed in a wash bath;

positioning an elevator beneath the surface of rinsing liquid of a process bath;

transferring the wafer from the wash bath to the process bath, and loading the wafer onto the elevator while the elevator is positioned beneath the surface of the rinsing liquid to thereby submerge the wafer in the rinsing liquid whereupon the wafer is rinsed;

moving a lid, defining a cavity in the bottom thereof of a size that will accommodate the wafer, over the process bath;

once the lid is disposed above the process bath, raising the elevator with the wafer disposed thereon to move the wafer into the cavity of the lid;

while the wafer is disposed in the cavity of the lid, injecting a dried gas into the cavity and onto the wafer to thereby dry the wafer within the cavity; and transferring the wafer from a position above the process bath to an unloading stage.

14. The drying method of claim 13, wherein the dried gas is injected onto the wafer while the wafer is being moved to the unloading stage.

15. The drying method of claim 13, wherein the dried gas is injected onto the wafer for both a predetermined period of time while the wafer is disposed directly over the process bath, and in the course of transferring the wafer from above the process bath to the unloading stage.

* * * * *